(12) United States Patent
Ando (10) Patent No.: US 7,749,677 B2
(45) Date of Patent: Jul. 6, 2010

(54) NEGATIVE RESIST COMPOSITION

(75) Inventor: Tomoyuki Ando, Kawasaki (JP)

(73) Assignee: Tokyo Ohka Kogyo Co., Ltd., Kawasaki-shi (JP)

( * ) Notice: Subject to any disclaimer, the term of this patent is extended or adjusted under 35 U.S.C. 154(b) by 291 days.

(21) Appl. No.: 10/593,004

(22) PCT Filed: Mar. 11, 2005

(86) PCT No.: PCT/JP2005/004326

§ 371 (c)(1),
(2), (4) Date: Sep. 14, 2006

(87) PCT Pub. No.: WO2005/091073

PCT Pub. Date: Sep. 29, 2005

(65) Prior Publication Data

US 2008/0241753 A1    Oct. 2, 2008

(30) Foreign Application Priority Data

Mar. 19, 2004    (JP) ............................. 2004-080481

(51) Int. Cl.
*G03F 7/038* (2006.01)
*G03F 7/20* (2006.01)
*G03F 7/30* (2006.01)
*G03F 7/36* (2006.01)

(52) U.S. Cl. .................... 430/270.1; 430/325; 430/311; 430/313; 430/905; 430/919; 430/921; 430/942

(58) Field of Classification Search ........................ None
See application file for complete search history.

(56) References Cited

U.S. PATENT DOCUMENTS

| 5,296,332 A | 3/1994 | Sachdev et al. |
| 6,340,734 B1 | 1/2002 | Lin et al. |
| 2002/0025495 A1 | 2/2002 | Ogata et al. |
| 2003/0099899 A1* | 5/2003 | Gronbeck et al. ........ 430/270.1 |
| 2003/0219676 A1 | 11/2003 | Barclay et al. |
| 2005/0282090 A1 | 12/2005 | Hirayama et al. |

FOREIGN PATENT DOCUMENTS

| JP | H05-249676 | 9/1993 |
| JP | 5-323609 A | 12/1993 |
| JP | 2001-5185 A | 1/2001 |
| JP | 2001-51422 A | 2/2001 |
| JP | 2004-341479 | 12/2004 |
| WO | WO 02/091083 A1 | 11/2002 |
| WO | WO 2004/051376 A1 | 6/2004 |
| WO | WO 2004/111734 A1 | 12/2004 |

OTHER PUBLICATIONS

Office Action issued on Sep. 2, 2008 on the counterpart Japanese Patent Application No. 2004-080481.

\* cited by examiner

*Primary Examiner*—Sin J. Lee
(74) *Attorney, Agent, or Firm*—Knobbe, Martens, Olson & Bear, LLP (57) ABSTRACT

The negative resist composition of the present invention comprises a silsesguioxane resin (A) comprising a constituent unit (a1) represented by the following general formula (I) and a constituent unit (a2) represented by the following general formula (II), an acid generator component (B) which generates an acid upon exposure, and a crosslinking agent component (C):

[Chemical Formula 1]

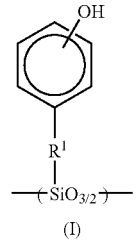

(I)

wherein $R^1$ represents a linear or branched alkylene group having 1 to 5 carbon atoms, and

[Chemical Formula 2]

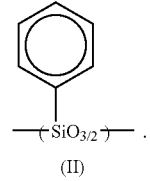

(II)

6 Claims, 2 Drawing Sheets

NEGATIVE RESIST COMPOSITION

CROSS-REFERENCE TO RELATED APPLICATIONS

This application is the U.S. National Phase filing under 35 U.S.C. §371 of PCT/JP2005/004326, filed Mar. 11, 2005, which designates the United States and was published in a language other than English, which claims priority under 35 U.S.C. §119(a)-(d) to Japanese Patent Application No. 2004-080481, filed Mar. 19, 2004. The content of these applications is incorporated herein by reference in their entireties.

TECHNICAL FIELD

The present invention relates to a negative resist composition.

BACKGROUND ART

In the production of semiconductor devices and liquid crystal displays, scaling-down technologies have rapidly been developed with the progress of a lithography method, recently. As one of resist materials satisfying the conditions of high resolution which can reproduce a pattern having a small size, a chemically amplified photoresist composition containing a base resin whose alkali solubility changes by an action of an acid, and an acid generator which generates an acid upon exposure is known. The chemically amplified photoresist composition includes a negative chemically amplified photoresist composition containing an acid generator, a crosslinking agent and an alkali soluble resin as a base resin, and a positive chemically amplified photoresist composition containing an acid generator and a resin whose alkali solubility is enhanced by an action of an acid.

Japanese Unexamined Patent Application, First Publication No. Hei 5-249676 relates to a chemically amplified negative photoresist composition and, in the example of the paragraph [0048], there is described a method for forming a resist layer by coating a resin composition containing poly(hydroxybenzylsilsesguioxane) on a layer made of a hard-baked diazoquinone novolak resin.

DISCLOSURE OF THE INVENTION

With respect to scaling-down of the size of resist patterns, it is required to achieve scaling-down of the size of a magnetic head so as to improve recording density of a magnetic recording medium in the filed of the magnetic recording medium. In order to achieve scaling-down of the size of the magnetic head, there is required a technology of forming a fine resist pattern including an isolated line pattern having a high aspect ratio, and an isolated pattern such as island pattern, thereby to form a fine magnetic film pattern.

In order to cope with scaling-down of the size of the resist pattern, for example, a two-layer resist method, a lift-off method and an electron beam lithography method have been proposed. It has been required to develop a photoresist having preferable resist characteristics so as to stably form a fine resist pattern having a high aspect ratio, particularly an isolated pattern having a high aspect ratio.

The negative resist described in Japanese Unexamined Patent Application, First Publication No. Hei 5-249676 has such problems that the unexposed area is inferior in alkali solubility and the exposed area is inferior in alkali insolubility so that it is insufficient in dissolution contrast, and that swelling occurs during the development of the resist pattern and thickness loss of the resist pattern occurs. Therefore, the negative resist was not suited for fine processing.

The present invention has been made so as to solve the problems described above and an object thereof is to provide a negative resist composition which can form a fine resist pattern having a high aspect ratio without causing thickness loss.

The above object can be achieved by a negative resist composition comprising a silsesguioxane resin (A) comprising a constituent unit (a1) represented by the following general formula (I) and a constituent unit (a2) represented by the following general formula (II), an acid generator component (B) which generates an acid upon exposure, and a crosslinking agent component (C):

[Chemical Formula 1]

(I)

wherein $R^1$ represents a linear or branched alkylene group having 1 to 5 carbon atoms, and

[Chemical Formula 2]

(II)

In the present invention, the "constituent unit" means a monomer unit constituting a polymer.

The "electron beam selective exposure" includes, in addition to an aspect of irradiating with electron beam through a mask, an aspect of direct writing without using a mask.

EFFECTS OF THE INVENTION

By using the negative resist composition of the present invention, a fine resist pattern having a high aspect ratio can be formed without causing thickness loss.

BRIEF DESCRIPTION OF THE REFERENCE SYMBOLS 1, 1': Substrate
2', 11': Magnetic film
2, 11: Magnetic film pattern
3, 12: Base film pattern
3', 12': Base film
4', 14': Resist film
4, 14: Resist pattern
5: Lift-off pattern
6: Electrode film,
10: Magnetic head (Read portion)

BEST MODE FOR CARRYING OUT THE INVENTION

The present invention will now be described in detail.

The negative resist composition of the present invention contains a silsesguioxane resin (A) (hereinafter referred to as a component (A), sometimes), an acid generator component (B) which generates an acid upon exposure (hereinafter referred to as a component (B), sometimes) and a crosslinking agent component (C).

In such a negative resist composition, when an acid is generated from the component (B) after the exposure, the crosslinking reaction between the component (A) and the component (C) is caused by the acid, and thus the exposed area is made insoluble in an alkali.

<Component (A)>

The silsesguioxane resin (A) comprises a constituent unit (a1) represented by the above general formula (I) and a constituent unit (a2) represented by the above general formula (II).

In the constituent unit (a1), $R^1$ is preferably a linear or branched lower alkylene group having 1 to 5 carbon atoms, more preferably a linear or branched alkylene group having 1 to 3 carbon atoms, and most preferably a methylene group in view of the synthesis of the resin. The position of a hydroxyl group may be any of the o-, m- and p-positions, but is preferably the p-position from an industrial point of view.

The silsesguioxane resin (A) may comprise, in addition to the constituent units (a1) and (a2), a constituent unit (a3) represented by the following general formula (III).

[Chemical Formula 3]

(III)

In the present invention, although the constituent unit (a3) is not essential, resolution can be improved by comprising this constituent unit. This constituent unit (a3) can be simply introduced by suppressing the dissociation degree of an alkoxy group because its starting material is the same as that of the constituent unit (a1).

In the general formula (III), $R^2$ is preferably a linear or branched alkylene group having 1 to 5 carbon atoms, and more preferably a linear or branched alkylene group having 1 to 3 carbon atoms in view of the synthesis of the resin, similar to the case of $R^1$. $R^3$ is preferably a linear or branched lower alkyl group having 1 to 5 carbon atoms, and most preferably a methyl group. The position of the bonding site of —$OR^3$ may be any of the o-, m- and p-positions, but is preferably the p-position from an industrial point of view.

The content of the constituent unit (a1) is preferably selected within a range from 50 to 95 mol %, and preferably from 60 to 80 mol %; the content of the constituent unit (a2) is preferably selected within a range from 5 to 40 mol %, and more preferably from 10 to 35 mol %; and the content of the constituent unit (a3) is preferably selected within a range from 0 to 20 mol %, and preferably from 1 to 10 mol %.

A weight average molecular weight (Mw) of the component (A) is not specifically limited and is preferably within a range from 1,000 to 15,000, and more preferably from 2,000 to 10,000. When Mw is too large, solubility in an organic solvent or a developing solution may become inferior. On the other hand, when Mw is too small, resist pattern profile may become inferior.

The dispersion degree Mw/Mn represented by the value obtained by dividing a weight average molecular weight (Mw) by a number average molecular weight (Mn) is not specifically limited, and is preferably within a range from 1.0 to 6.0, and more preferably from 1.0 to 2.0. When the dispersion degree is more than the above range, resolution and pattern shape may become inferior.

<Component (B)>

In the present invention, the component (B) can be used after selecting from known acid generators used in a conventional chemically amplified photoresist composition without being specifically limited. As the acid generator, there have hitherto been known various acid generators, for example, onium salt-based acid generator such as iodonium salt or sulfonium salt; oxime sulfonate-based acid generator; diazomethane-based acid generator such as bisalkyl or bisarylsulfonyl diazomethanes, or poly(bissulfonyl)diazomethanes; iminosulfonate-based acid generator; and disulfone-based acid generator.

Specific examples of the onium salt-based acid generator include trifluoromethanesulfonate or nonafluorobutanesulfonate of diphenyliodonium; trifluoromethanesulfonate or nonafluorobutanesulfonate of bis(4-tert-butylphenyl)iodonium; trifluoromethanesulfonate of triphenylsulfonium, heptafluoropropanesulfonate thereof or nonafluorobutanesulfonate thereof; trifluoromethanesulfonate of tri(4-methylphenyl)sulfonium, heptafluoropropanesulfonate thereof or nonafluorobutanesulfonate thereof; trifluoromethanesulfonate of dimethyl(4-hydroxynaphthyl)sulfonium, heptafluoropropanesulfonate thereof or nonafluorobutanesulfonate thereof, trifluoromethanesulfonate of monophenyldimethylsulfonium, heptafluoropropanesulfonate thereof or nonafluorobutanesulfonate thereof; trifluoromethanesulfonate of diphenylmonomethylsulfonium, heptafluoropropanesulfonate thereof or nonafluorobutanesulfonate thereof. Among these onium salt-based acid generators, an onium salt containing a fluorinated alkylsulfonic acid ion as an anion is preferable.

Specific examples of the oxime sulfonate-based acid generator include α-(methylsulfonyl oxyimino)-phenylacetonitrile, α-(methylsulfonyl oxyimino)-p-methoxyphenylacetonitrile, α-(trifluoromethylsulfonyl oxyimino)-phenylacetonitrile, α-(trifluoromethylsulfonyl oxyimino)-p-methoxyphenylacetonitrile, α-(ethylsulfonyl oxyimino)-p-methoxyphenylacetonitrile, α-(propylsulfonyl oxyimino)-p-methylphenylacetonitrile, α-(methylsulfonyl oxyimino)-p-bromophenylacetonitrile and bis-O-(n-butylsulfonyl)-α-dimethylglyoxime.

Among these oxime sulfonate-based acid generators, α-(methylsulfonyl oxyimino)-p-methoxyphenylacetonitrile and bis-O-(n-butylsulfonyl)-α-dimethylglyoxime are preferable.

Specific examples of the bisalkyl or bisarylsulfonyl diazomethanes among the diazomethane-based acid generators include bis(isopropylsulfonyl)diazomethane, bis(p-toluenesulfonyl)diazomethane, bis(1,1-dimethylethylsulfonyl)diazomethane, bis(cyclohexylsulfonyl)diazomethane and bis(2,4-dimethylphenylsulfonyl)diazomethane.

Examples of the poly(bissulfonyl)diazomethanes include 1,3-bis(phenylsulfonyl diazomethylsulfonyl)propane (compound A, decomposition point: 135° C.), 1,4-bis(phenylsulfonyl diazomethylsulfonyl)butane (compound B, decomposition point: 147° C.), 1,6-bis(phenylsulfonyl diazomethylsulfonyl)hexane (compound C, melting point: 132° C., decomposition point: 145° C.), 1,10-bis(phenylsulfonyl diazomethylsulfonyl)decane (compound D, decomposition point: 147° C.), 1,2-bis(cyclohexylsulfonyl diazomethylsulfonyl)ethane (compound E, decomposition point: 149° C.), 1,3-bis(cyclohexylsulfonyl diazomethylsulfonyl)propane (compound F, decomposition point: 153° C.), 1,6-bis(cyclohexylsulfonyl diazomethylsulfonyl)hexane (compound G, melting point: 109° C., decomposition point: 122° C.) and 1,10-bis(cyclohexylsulfonyl diazomethylsulfonyl)decane (compound H, decomposition point: 116° C.), each having the above structure.

[Chemical Formula 4]

As the component (B), acid generators may be used alone or in combination.

The content of the component (B) is adjusted within a range from 0.5 to 30 parts by weight, and preferably from 1 to 15 parts by weight, based on 100 parts by weight of the component (A). When the content is less than the above range, formation of a pattern may not be sufficiently conducted. On the other hand, when the content is more than the above range, a uniform solution may be hardly obtained thereby to deteriorate storage stability.

When the oxime sulfonate-based acid generator is used in combination with the diazomethane-based acid generator, a mixing weight ratio is preferably within a range from 60:40 to 95:5 because resolution or resist pattern shape are improved, and is most preferably from 80:20 to 95:5.

<Component (C)>

The crosslinking agent component (C) can be optionally selected from those which are conventionally used as a crosslinking agent of a known chemically amplified negative photoresist, for example, those having at least one crosslink-forming group selected from a hydroxyalkyl group and a lower alkoxyalkyl group, and is not specifically limited.

Examples of the crosslinking agent include compounds obtained by reacting an amino group-containing compound such as melamine, acetoguanamine, benzoguanamine, urea, ethyleneurea, propyleneurea or glycoluril with formaldehyde or formaldehyde and a lower alcohol, thereby to substitute a hydrogen atom of the amino with a hydroxymethyl group or a lower alkoxymethyl group, and specific examples thereof include hexamethoxymethylmelamine, bismethoxymethylurea, bismethoxymethylbismethoxyethyleneurea, tetrakismethoxymethyl glycoluril and tetrakisbutoxymethyl glycoluril.

Among these crosslinking agents, a compound obtained by reacting urea with formaldehyde or formaldehyde and a lower alcohol, especially a lower alcohol having 1 to 4 carbon atoms, thereby to substitute a hydrogen atom of the amino group with a hydroxymethyl group or a lower alkoxymethyl group, especially a lower alkoxymethyl group, an alkyl group of which has 1 to 4 carbon atoms, for example, bismethoxymethylurea is used particularly preferably because a good pattern is formed without being influenced drastically by the amount and a negative photoresist composition is easily prepared.

These components (C) may be used alone or in combination.

The content of the component (C) is preferably within a range from 3 to 50 parts by weight, and more preferably from 5 to 20 parts by weight, based on 100 parts by weight of the component (A). When the content of the component (C) is less than the above range, crosslink formation does not sufficiently process and a good resist pattern can not be obtained. On the other hand, when the content of the component (C) is more than the above range, particles are produced during the storage of the resist composition and thus storage stability and sensitivity may deteriorate with time.

A combination of the component (B) and the component (C) is particularly preferably a combination of an onium salt containing a fluorinated alkylsulfonic acid ion as an anion (B) and a glycoluril-based or melamine-based crosslinking agent (C), a combination of an oxime sulfonate-based acid generator (B) and an ethyleneurea-based crosslinking agent (C), or a combination of a mixture of an oxime sulfonate-based acid generator and a diazomethane-based acid generator (B) and an ethyleneurea-based crosslinking agent (C). By using the specific component (B) with the specific component (C), a fine pattern can be formed without causing thickness loss of a resist pattern.

<Component (D)>

In order to improve resist pattern shape and post exposure stability of the latent image formed by the pattern wise exposure of the resist layer, the negative resist composition of the present invention can contain, as an optional component, a nitrogen-containing organic compound (D) (hereinafter referred to as a component (D)).

Since various compounds have already been proposed, this component (D) may be optionally selected from known compounds, and is preferably amine, and particularly preferably secondary aliphatic amine or tertiary aliphatic amine.

Specific examples of the component (D) include alkylamine such as trimethylamine, diethylamine, triethylamine, di-n-propylamine, tri-n-propylamine, tripentylamine, tri-n-heptylamine, tri-n-octylamine, di-n-heptylamine, di-n-octylamine or tri-n-dodecylamine; and amine of alkyl alcohol, such as diethanolamine, triethanolamine, diisopropanolamine, triisopropanolamine, di-n-octanolamine or tri-n-octanolamine. Among these compounds, secondary or tertiary aliphatic amine which has an alkyl group having 7 to 15 carbon atoms is preferable. When the aliphatic amine has an alkyl group having 7 to 15 carbon atoms, the aliphatic amine is hardly diffused in the resist pattern thus formed and therefore it can be uniformly distributed. In the present invention, an alkylamine such as tri-n-octylamine or tri-n-dodecylamine is preferable.

These amines may be used alone or in combination.

The component (D) is usually used in the amount within a range from 0.01 to 5.0 parts by weight based on 100 parts by weight of the component (A).

<Component (E)>

For the purpose of preventing deterioration of sensitivity due to mixing with the component (D) and improving resist pattern shape and post exposure stability of the latent image formed by the pattern wise exposure of the resist layer, the negative resist composition of the present invention can contain, as an optional component, an organic carboxylic acid or oxo acid of phosphorus or its derivative (E) (hereinafter referred to as a component (E)). The component (D) and the component (E) can be used alone or in combination.

As the organic carboxylic acid, for example, malonic acid, citric acid, malic acid, succinic acid, benzoic acid and salicylic acid are preferable.

Examples of the oxo acid of phosphorus or its derivative include phosphoric acid or its derivative such as ester, for example, phosphoric acid, di-n-butyl phosphate or diphenyl phosphonate; phosphonic acid or its derivative such as ester, for example, phosphonic acid, dimethyl phosphonate, di-n-butyl phosphonate, phenylphosphonic acid, diphenyl phosphonate or dibenzyl phosphonate; and phosphinic acid or its derivative such as ester, for example, phosphinic acid or phenylphosphinic acid. Among these, phosphonic acid is particularly preferable.

The component (E) is used in the amount within a range from 0.01 to 5.0 parts by weight based on 100 parts by weight of the component (A).

<Other Optional Components>

To the negative resist composition of the present invention, additive having miscibility, for example, additive resins for improving performances of the resist film, surfactants for improving coatability, plasticizers, stabilizers, colorants and antihalation agents can be appropriately added, if necessary.

<Organic Solvent>

The negative resist composition of the present invention can be prepared by dissolving materials such as components (A), (B) and (C) described above in an organic solvent.

The organic solvent may be any one which can dissolve the respective components used to give a uniform solution, and one or more kinds of organic solvents can be appropriately selected from solvents for chemically amplified photoresist which have conventionally been known.

Examples of the organic solvent include ketones such as γ-butyrolactone, acetone, methyl ethyl ketone, cyclohexanone, methyl isoamyl ketone and 2-heptanone; polyhydric alcohols and derivatives thereof, such as ethylene glycol, ethylene glycol monoacetate, diethylene glycol, diethylene glycol monoacetate, propylene glycol, propylene glycol monoacetate, dipropylene glycol, and monomethyl ether, monoethyl ether, monopropyl ether, monobutyl ether and monophenyl ether of dipropylene glycol monoacetate; cyclic ethers such as dioxane; and esters such as methyl lactate, ethyl lactate (EL), methyl acetate, ethyl acetate, butyl acetate, methyl pyruvate, ethyl pyruvate, methyl methoxypropionate and ethyl ethoxypropionate.

These organic solvents may be used alone or in combination.

The amount of the organic solvent is not specifically limited and is appropriately set according to the thickness of a coating film so as to adjust to the concentration which enables application onto a substrate, and is generally within a range from 2 to 20% by weight, and preferably from 5 to 15% by weight, in terms of the solid content of the resist composition.

The negative photoresist composition of the present invention can be preferably used for a two-layer resist method. That is, the negative resist composition of the present invention can be used as the material of the resist layer in a two-layer resist method comprising the steps of providing an organic layer on a substrate and providing a resist layer on the organic layer; patterning the resist layer to form an upper resist pattern; patterning the organic layer by dry etching using the upper resist pattern as a mask to form a lower resist pattern; and forming a pattern (fine pattern) on the substrate by etching using the upper resist pattern and the lower resist pattern as a mask.

According to the negative resist composition of the present invention, resist characteristics suited for forming a fine pattern by the two-layer resist method can be obtained and a fine isolated pattern can be stably formed while preventing thickness loss.

The negative resist composition of the present invention can be preferably used for a magnetic film pattern forming method comprising the step of patterning a magnetic film by ionic etching using the resist pattern formed on the magnetic film as a mask. The magnetic film pattern forming method includes a method in which a resist pattern is directly formed on a magnetic film on ionic etching and a method in which a base film pattern is present between a magnetic film and a resist pattern (lift-off method), and the negative resist composition of the present invention can be preferably used for both methods. The former method is suited for production of a write portion of a magnetic head (magnetic head for writing) and the latter method is suited for production of a read portion (magnetic head for reading).

The negative resist composition of the present invention has resist characteristics suited to stably form a fine isolated line pattern and also can form a resist pattern having a high aspect ratio while preventing thickness loss because there is a proper difference in etching rate between the negative resist composition and the magnetic film on ionic etching. Therefore, it is possible to realize scaling-down of the size of a magnetic film pattern.

The negative photoresist composition of the present invention can be exposed to KrF excimer laser because it has sensitivity at 248 nm, and is also preferably used for electron beam lithography because it has sensitivity to electron beam. That is, the negative photoresist composition of the present invention can be preferably used for a resist pattern forming method comprising the step of subjecting a resist layer to electron beam selective exposure.

Electron beam lithography includes low energy electron beam projection lithography at an acceleration voltage of about 2 to 5 kV and high energy electron beam projection lithography at an acceleration voltage of about 30 to 100 kV, each including a method of irradiating with electron beam through a mask and a method of direct writing without using a mask. The negative photoresist composition of the present invention can be preferably used for any method.

By using the negative resist composition of the present invention and using electron beam in selective exposure, an isolated pattern such as fine isolated line pattern or island pattern can be formed, efficiently and stably. That is, when a trial of forming an isolated pattern is made using a positive resist, it is necessary to conduct electron beam writing to the entire periphery of the site at which the isolated pattern is formed. On the other hand, when a negative resist is used, electron beam writing may be conducted only to the site at which the isolated pattern is formed and therefore the time required for writing is shorten. Thus, throughput of the production process can be improved.

When high energy electron beam projection lithography is used, the site which should be insoluble on development is sometimes irradiated with electron beam by an influence of electrons which penetrate through the resist film and accumulated (back scattering).

In this case, dissolution characteristic may become unstable in the positive resist and thickness loss of the resist pattern may occur. However, in the negative resist composition of the present invention, since the area irradiated with electron beam is made insoluble, disadvantages such as thickness loss of the resist pattern due to back scattering can be avoided.

According to the negative photoresist composition of the present invention, good resist characteristics can be obtained and scaling-down of the size of the resist pattern can be achieved without impairing advantages of the negative composition. The reason why such an effect is obtained is considered that a component (A) serving as a base resin is composed of a copolymer comprising the unit (a1) and the unit (a2) unit.

<Two-Layer Resist Method>

Embodiments of the method for forming a resist pattern by a two-layer resist method using a negative resist composition of the present invention will now be described.

First, an organic layer is formed on a substrate.

The substrate is not specifically limited and conventionally known substrates can be used and includes, for example, substrate for electronic components and substrate having a predetermined wiring pattern formed thereon. Examples of the substrate include substrates made of metals such as silicon wafer, copper, chromium, iron and aluminum, and glass substrate. As the material of a wiring pattern, for example, copper, aluminum, nickel and gold can be used.

The organic layer is composed of an organic film which is insoluble in an alkali developing solution used in the development after the exposure and is also etchable by a conventional dry etching method.

The organic film material constituting the organic layer unnecessarily does not require photosensitivity, like the resist layer formed thereon. A resist material and a resin material, which are generally used in the production of a semiconductor device and a liquid crystal display, may be used.

The organic layer is preferably made of the material which is etchable with oxygen plasma.

As such a material, a material containing, as a main component, at least one selected from the group consisting of novolak resin, acrylic resin and soluble polyimide is preferably used because etching with oxygen plasma is easily conducted and also resistance to a fluorocarbon-based gas used to etch a silicon substrate in the post-process is excellent. Among these materials, a novolak resin and an acrylic resin having an alicyclic site or an aromatic ring in the side chain is cheap and is commonly used, and is preferably used because they are excellent in dry etching resistance in the post-process.

As the novolak resin, a commercially available novolak resin can be used and is preferably a novolak resin in which the content of low molecular weight components having a weight average molecular weight (Mw) of 5,000 to 50,000, and preferably 8,000 to 30,000 and a molecular weight of 500 or less, and preferably 200 or less is 1% by weight or less, and preferably 0.8% by weight or less in gel permeation chromatography. The smaller, the content of the low molecular weight components, the better, and the content is preferably 0% by weight.

As used herein, "low molecular weight components having a molecular weight of 500 or less" are detected as low molecular weight fractions having a polystyrene equivalent molecular weight of 500 or less determined using GPC. "Low molecular weight components having a molecular weight of 500 or less" include an unpolymerized monomer or a component having a low polymerization degree, for example, a component obtained by condensing 2 to 5 molecules of phenols with aldehydes, although it depends on the molecular weight.

The content of the low molecular weight components having a molecular weight of 500 or less (% by weight) is measured by the following procedure. That is, with respect of analytical results by GPC, the fraction number (abscissas) is plotted against the concentration (ordinate) to obtain a graph and the area under a curve (%) of a low molecular weight fraction having a molecular weight of 500 or less to the entire area under a curve is measured.

It is preferred to adjust Mw of a novolak resin as the organic film material to 50,000 or less because embedding characteristics to the substrate having fine irregularity to the substrate is excellent, and it is preferred to adjust Mw to 5,000 or more because etching resistance to a fluorocarbon-based gas is excellent.

When the content of the low molecular weight components having a molecular weight of 500 or less is less than 1% by weight or less, embedding characteristics to a substrate having fine irregularity are improved. The reason why embedding characteristics are improve by decreasing the content of the low molecular weight components is not clears but is considered that dispersion degree may be decreased, AS the acrylic resin constituting the organic film, an acrylic resin, which is generally used in the photoresist composition, can be used and includes, for example, an acrylic resin comprising a constituent unit derived from a polymerizable compound having an ether bond, and a constituent unit derived from a polymerizable compound having a carboxyl group.

The soluble polyimide constituting the organic film is polyimide which can be converted into a liquid by dissolving in the above organic solvent.

The organic layer can be formed by coating a solution of a material constituting the organic layer using a spinner and baking under the heating conditions of a temperature of 200 to 300° C. for 30 to 300 seconds, and preferably 60 to 180 seconds.

On the organic layer, the negative resist composition of the present invention is coated using a spinner, followed by prebaking under the temperature conditions of 70 to 150° C., and preferably 80 to 140° C. for about 0.5 to 60 minutes, preferably 40 to 180 seconds, more preferably 60 to 90 seconds, to form a resist layer, and thus a resist laminate is obtained.

The total thickness of an upper resist layer and a lower organic layer in the resist laminate is preferably 15 µm or less, and more preferably 6 µm or less, in view of balance of throughput taking account of an aspect ratio of the objective resist pattern and a time required to dry etching of an organic layer. The lower limit of the total thickness is not specifically limited and is preferably 0.3 µm or more, and more preferably 0.35 µm or more.

The thickness of the upper resist layer is preferably within a range from 30 to 500 nm, and more preferably from 50 to 300 nm. When the thickness of the resist layer is within the above range, there can be exerted the effect capable of forming a resist pattern can be formed at high resolution and obtaining sufficient resistance to dry etching.

The thickness of the lower organic layer is preferably within a range from 100 to 14000 nm, and more preferably from 300 to 5000 nm. When the thickness of the organic layer is adjusted within the above range, there can be exerted the effect capable of forming a resist pattern having a high aspect ratio and ensuring sufficient etching resistance on substrate etching.

An organic or inorganic antireflection film may be provided between an organic layer and a resist layer.

Then, the resulting resist laminate is subjected to selective exposure. Electron beam is effective as a light source so as to achieve scaling-down of the size, and radiations such as KrF excimer laser, ArF excimer laser, $F_2$ laser, extreme ultraviolet ray (EUV), vacuum ultraviolet ray (VUV), X-ray and soft X-ray can also be applied.

In case of using electron beam, low energy electron beam is preferably used and, for example, low energy electron beam projection lithography (LEEPL) using a mask can be preferably used.

After selective exposure, the resist laminate is subjected to post exposure bake (PEB) under the temperature conditions of 70 to 130° C. for 40 to 180 seconds, and preferably 60 to 90 seconds.

Subsequently, the baked resist laminate is subjected to a development treatment using an alkali developing solution, for example, an aqueous tetramethylammonium hydroxide solution having a concentration of 0.05 to 10% by weight, and preferably 0.05 to 3% by weight. Then, the upper resist layer is appropriately subjected to a rinsing treatment or drying treatment to form an upper resist pattern.

Then, dry etching of the organic layer is conducted using the resulting upper resist pattern as a mask pattern to form a lower resist pattern on the organic layer.

As the dry etching method, there can be used known methods, for example, chemical etching method such as down flow etching or chemical dry etching; physical etching method such as sputter etching or ion beam etching method; and chemical and physical etching method such as reactive ion etching (RIE).

Most popular dry etching method is a method using a parallel plate RIE system. According to this method, first, a resist laminate is placed in a chamber of the RIE system and a required etching gas is introduced. When a high frequency voltage is applied to a holder of the resist laminate placed in parallel to an upper electrode in the chamber, the gas is converted into plasma. In the plasma, charged particles such as positive and negative ions and electrons, and neutral active species are present. When these etching species are adsorbed on the lower organic layer, the chemical reaction arises and the reaction product is desorbed and discharged out of the system, and thus etching proceeds.

The etching gas includes oxygen and sulfur dioxide. Oxygen is preferably used because etching with oxygen plasma shows high resolution and the component (A) of the present invention has high etching resistance to oxygen plasma and also it is commonly used.

Thus, a resist pattern comprising an upper resist pattern and a lower resist pattern, which are laminated with each other, is obtained and therefore a fine pattern is formed on the substrate by etching using the resulting resist pattern as a mask.

As the etching method, an etching method using a halogen-based gas can be preferably used.

According to such a resist pattern forming method, first, only an upper resist layer is subjected to exposure and alkali development using conventional photolithography to form an upper resist pattern and an organic layer is dry-etched using the upper resist pattern as a mask, thereby to transfer a pattern of the resist layer (upper resist pattern) onto the organic layer.

As a result, a resist pattern having a high aspect ratio can be formed without causing pattern collapse.

Since the resist pattern is formed using a laminate comprising a lower organic layer and an upper resist layer, which are laminated with each other, thinning of the resist layer can be conducted even when a pattern having a high aspect ratio is formed. By thinning the resist layer, resolution is improved, while line edge roughness and edge roughness of hole pattern (referred to as edge roughness, sometimes) tends to become remarkable. In the resist composition constituting the resist layer in the present invention, preferable alkali solubility can be obtained and thus generation of edge roughness can be reduced.

<Magnetic Film Pattern Forming Method (1)>

As the first embodiment of the method for forming a magnetic film pattern using the negative resist composition of the present invention, a method of forming a read portion of a magnetic head using a lift-off method will now be described with reference to FIG. 1A to FIG. 1E.

Figure 1A:
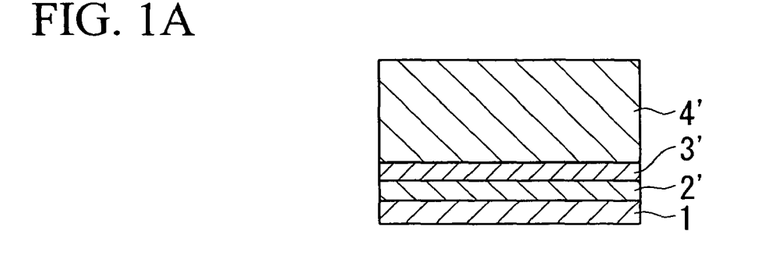
FIG. 1A is a schematic view showing the first embodiment of a method for forming a magnetic film pattern in the order of processes.

First, as shown in FIG. 1A, a magnetic film 2' is laminated on a substrate 1 and, furthermore, a base film 3' is formed thereon.

The substrate 1 is not specifically limited and a silicon wafer is used. The substrate 1 may be subjected to a surface modification treatment using a silane coupling agent such as hexamethyldisilazane (HMDS).

A magnetic material used in the magnetic film 2' on the substrate 1 may be a conventionally known magnetic material and, for example, magnetic materials containing elements such as Ni, Co, Cr and Pt are used alone or several kinds of magnetic materials may be laminated on the substrate. The thickness of the magnetic film 2' is preferably adjusted within a range from about 100 to 1000 nm.

The material constituting a base film on the magnetic film 2' is not specifically limited. As an alkali soluble material, for example, a coating solution of polymethylglutarimide (hereinafter abbreviated to PMGI) manufactured by Chypre Co. is used. As the alkali insoluble material, there can be used a coating solution of a material, which has hitherto been used as an base antireflection coating (BARC) in the form of, and an organic film which is insoluble in an alkali developing solution and is also etchable with a conventional dry etching method. The coating solution of the above material is coated using a spin coater and then dried to form a base film 3'. The thickness of the base film 3' is within a range from 300 to 14000 nm, and preferably from about 400 to 5000 nm.

The negative resist composition of the present invention is coated on the base film 3' using a spinner and then prebaked (PAB treatment) to form a resist film 4'. The prebaking conditions vary depending on the kind of the respective components in the composition, the blending ratio and the coating thickness. Prebaking is usually conducted at a temperature of 70 to 150° C., preferably 80 to 140° C. for about 0.5 to 60 minutes, preferably 40 to 180 seconds, and more preferably 60 to 90 seconds. The thickness of the resist film 4' is 300 nm or less, and preferably from about 50 to 200 nm.

Then, the resist film 4' is subjected to selective exposure through a mask pattern. As a light source used for exposure, electron beam is effective so as to achieve scaling-down of the size, and radiations such as KrF excimer laser, ArF excimer laser, $F_2$ excimer laser, extreme ultraviolet ray (EUV), extreme ultraviolet ray (VUV), X-ray and soft X-ray can be applied.

After the selective exposure, the resist film is subjected to post exposure bake (PEB). The heating conditions in the PEB step vary depending on the kind of the respective components in the composition, the blending ratio and the coating thickness. Heating is usually conducted at a temperature of 70 to 130° C., preferably 80 to 120° C. for 40 to 180 seconds, and preferably about 60 to 90 seconds.

Subsequently, the resist film is subjected to a development treatment using an alkali developing solution, for example, an aqueous tetramethylammonium hydroxide solution having a concentration of 0.05 to 10% by weight, and preferably 0.05 to 3% by weight. Then, a rinsing treatment or a drying treatment is conducted, and thus the unexposed area of the resist film 4' is removed by an alkali development to obtain a resist pattern 4. When an alkali soluble base film is used, the base film 3' located under the area subjected to the alkali development of the resist film 4' is simultaneously developed with an alkali developing solution. However, since the base film 3' has higher alkali solubility than that of the resist film 4', a lift-off pattern 5 having a battledore-shaped cross section, comprising a pattern of a base film 3' (base film pattern) 3 having a narrow width shown in FIG. 1B and a resist pattern 4 of a resist film 4', which has a width wider than that of the base film pattern, can be obtained, as a result of the alkali development. The developing time can be set so as to obtain a desired resist pattern shape. When the developing time is too short, trailing of a pattern may occur or the unexposed area and the residue on the other area may occur. On the other hand, when the developing time is too long, thickness loss occurs. Therefore, the developing time is preferably adjusted within a range from 25 to 180 seconds, and most preferably from 30 to 120 seconds.

Figure 1B:
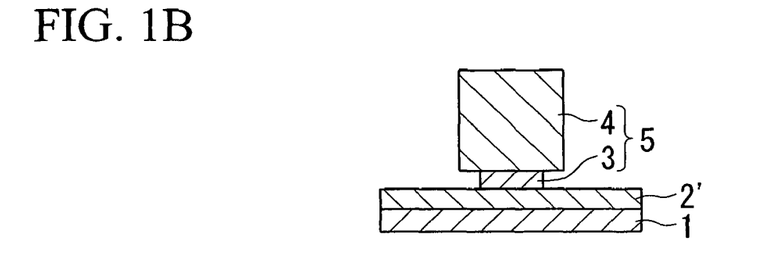
FIG. 1B is a schematic view showing the first embodiment of a method for forming a magnetic film pattern in the order of processes.

When an alkali insoluble base film is used, the base film 3' is overetched using the resist pattern 4 as a mask, and thus a lift-off pattern 5 having a battledore-shaped cross section, comprising a pattern of a base film 3' (base film pattern) 3 having a narrow width shown in FIG. 1B and a resist pattern 4 of a resist film 4', which has a width wider than that of the base film pattern, can be obtained.

Figure 1C:
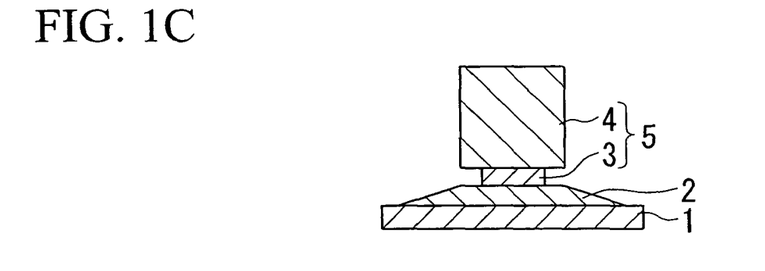
FIG. 1C is a schematic view showing the first embodiment of a method for forming a magnetic film pattern in the order of processes.

Using the lift-off pattern 5 thus obtained as a mask, ionic etching is conducted. Consequently, as shown in FIG. 1C, the magnetic film 2' around the pattern 5 is etched to form a magnetic film pattern 2 under and around the pattern 5. As ionic etching, ion milling is preferably used.

Figure 1D:
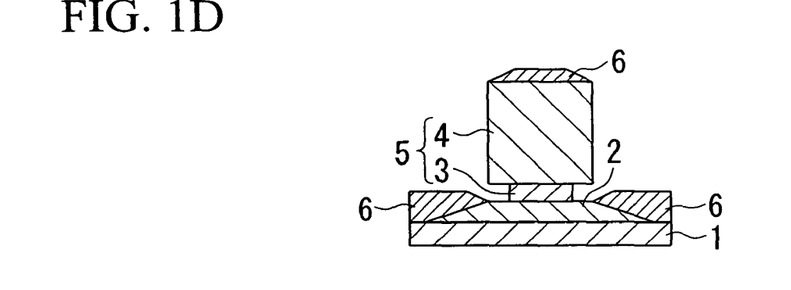
FIG. 1D is a schematic view showing the first embodiment of a method for forming a magnetic film pattern in the order of processes.

Subsequently, as shown in FIG. 1D, by sputtering, an electrode film 6 is formed on the pattern 5 and formed on a substrate 1 around the magnetic film pattern 2.

Figure 1E:
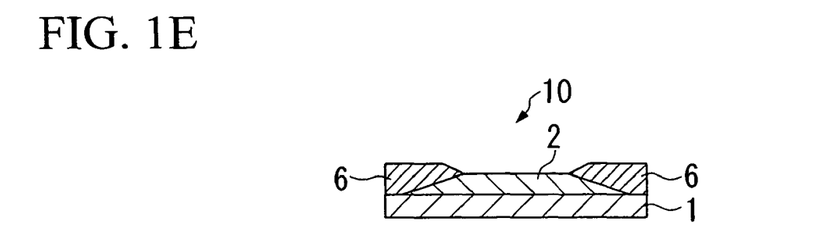
FIG. 1E is a schematic view showing the first embodiment of a method for forming a magnetic film pattern in the order of processes.

When an alkali soluble base film is used, the base film pattern 3 is dissolved using an alkali developing solution again. When the alkali insoluble base film is used, the method is not specifically limited as far as it does not exert an adverse influence on the magnetic film, and a known method such as remover or oxygen plasma ashing can be used. Consequently, the resist pattern 4 of the resist film 4' is removed and, as shown in FIG. 1E, there can be obtained a read portion 10 of a magnetic head, comprising a substrate 1, a magnetic film pattern 2 having a desired width formed on the substrate, and an electrode film 6 formed around the substrate.

According to the present embodiment, by using the negative resist composition of the present invention, preferable dissolution characteristics are obtained on the development and an etching selection ratio can be taken with the base film, and therefore the thickness of the resist film can be reduced and a fine lift-off pattern can be formed. The lift-off pattern thus obtained is excellent in rectangularity of profile of the resist pattern portion and is less likely to cause pattern collapse, and is also excellent in resolution.

The negative resist composition of the present invention is suited to form a fine isolated line pattern using electron beam in selective exposure and also throughput in the exposure step using electron beam is good.

<Magnetic Film Pattern Forming Method (2)>

As the second embodiment of the method for forming a magnetic film pattern using the negative resist composition of the present invention, a method for forming a write portion of a magnetic head using a two-layer resist method will now be described in detail with reference to FIG. 2A to FIG. 2D.

Figure 2A:
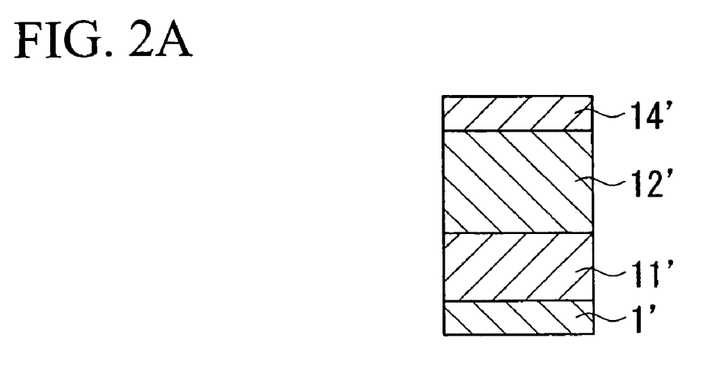
FIG. 2A is a schematic view showing the second embodiment of a method for forming a magnetic film pattern in the order of processes.

First, as shown in FIG. 2A, a magnetic film 11' is laminated on a substrate 1'.

The substrate 1' and the magnetic film 11' are the same as those in the magnetic film pattern forming method (1).

Then, a coating solution of the alkali insoluble material described in the magnetic film pattern forming method (1) is coated on the magnetic film 11' using a spin coater and dried to form a base film 12'. The thickness of the base film 12' is from 100 to 14,000 nm, and preferably from about 300 to 5,000 nm.

Then, the negative resist composition of the present invention is coated on the base film 12' using a spinner and prebaked (PAB treatment) to form a resist film 14'. The prebaking conditions are the same as those in the magnetic film pattern forming method (1).

The thickness of the resist film 14' is from 30 to 500 nm, and preferably from abut 50 to 300 nm.

Then, the resulting resist film 14' is subjected to selective exposure through a mask pattern. Electron beam is effective as a light source so as to achieve scaling-down of the size, and radiations such as KrF excimer laser, ArF excimer laser, F2 laser, extreme ultraviolet ray (EUV), vacuum ultraviolet ray (VUV), X-ray and soft X-ray can also be applied. In case of using electron beam, high energy electron beam is used particularly preferably.

Figure 2B:
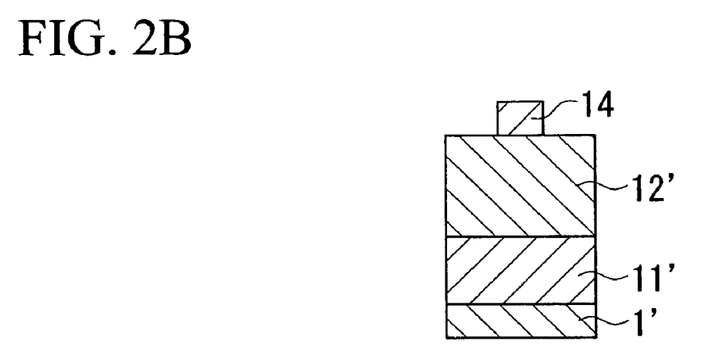
FIG. 2B is a schematic view showing the second embodiment of a method for forming a magnetic film pattern in the order of processes.

After the selective exposure, the resist film is subjected to post exposure bake (PEB) and an alkali development treatment, and then subjected to a rinsing treatment or a drying treatment. Consequently, as shown in FIG. 2B, the unexposed area of the resist film 14' is removed by an alkali development to obtain a resist pattern 14.

The developing time can be set so as to obtain a desired resist pattern shape. When the developing time is too short, trailing of a pattern may occur or the unexposed area and the residue on the other area may occur. On the other hand, when the developing time is too long, thickness loss occurs. Therefore, the developing time is preferably adjusted within a range from 25 to 180 seconds, and most preferably from 30 to 120 seconds.

Figure 2C:
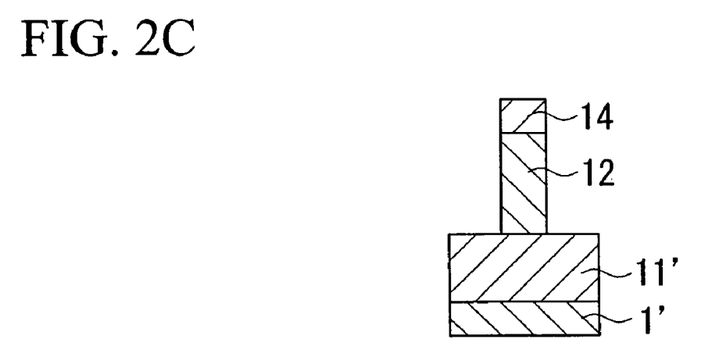
FIG. 2C is a schematic view showing the second embodiment of a method for forming a magnetic film pattern in the order of processes.
Figure 2D:
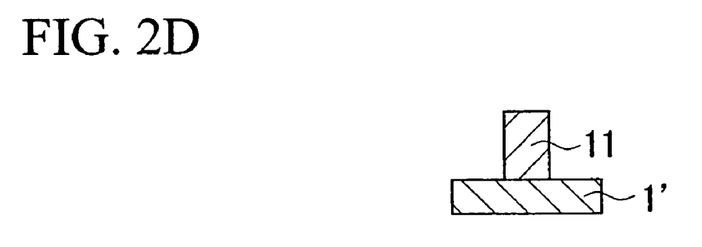
FIG. 2D is a schematic view showing the second embodiment of a method for forming a magnetic film pattern in the order of processes.

Using the resist pattern 14 thus obtained as a mask, the base film 12' is etched to form a base film pattern 12 as shown in FIG. 2C. Patterning of the magnetic film 11' is conducted by ionic etching using a laminate of the resist pattern 14 and the base film pattern 12 as a mask, and then the resist pattern 14 and the base film pattern 12 are removed by using a known method such as remover or oxygen plasma ashing to obtain a magnetic film pattern 11 as shown in FIG. 2D. As ionic etching, ion milling is preferably used.

In case of etching the base film 12', the resist pattern 14 as the upper layer is capable of taking an etching selection ratio with the base film 12', and therefore the aspect ratio of the laminate comprising the resist pattern 14 and the base film pattern 12 can be increased.

By setting a proper difference between the etching rate of the resist pattern 14 and the base film pattern 12 and the etching rate of the magnetic film 11' on ionic etching, as shown in FIG. 2D, a fine magnetic film pattern 11 having a high aspect ratio can be formed. It is preferred that densification of magnetic recording can be conducted by using a fine magnetic film pattern having a high aspect ratio.

Thus, a write portion of a magnetic head comprising a substrate 1' and a magnetic film pattern 11 having a predetermined width formed on the substrate can be obtained.

According to the present embodiment, a fine magnetic film pattern having a high aspect ratio can be formed by using the negative resist composition of the present invention.

The negative resist composition of the present invention is suited to form a fine isolated line pattern using electron beam in selective exposure, and is also excellent in throughput in the exposure step using electron beam. Therefore, it is possible to preferably cope with scaling-down of the size of the write portion of the magnetic head and to contribute to densification of the magnetic recording medium.

While the production of a general magnetic head was described, the negative resist composition of the present invention can be preferably used for the production of magnetic random access memory (MRAM), micro electro mechanical systems (MEMS) and vertical magnetic head.

EXAMPLES

The present invention will now be described in more detail by way of examples, but the scope of the present invention is not limited to these examples.

Synthesis Example of Silsesguioxane Resin

Synthesis Example 1

In a 500 ml three-necked flask equipped with a stirrer; a reflux condenser, a dropping funnel and a thermometer, 1.00 mol (84.0 g) of sodium hydrogen carbonate and 400 ml of water were charged and 0.36 mol (92.0 g) of p-methoxybenzyltrichlorosilane and 0.14 mol (29.6 g) of phenyltrichlorosilane were dissolved in 100 ml of diethylether, and then added dropwise through the dropping funnel while stirring for 2 hours, followed by reflux for one hour. After the completion of the reaction, the reaction product was extracted from diethylether and diethylether was distilled off under reduced pressure from the extract.

To the hydrolysate thus obtained, an aqueous 10 wt % potassium hydroxide solution was added, followed by heating at 200° C. for 2 hours to obtain a copolymer $A_1$ (64.4 g) comprising 72 mol % of p-methoxybenzylsilsesguioxane and 28 mol % of phenylsilsesguioxane.

Then, this copolymer $A_1$ was dissolved in 150 ml of acetonitrile and 0.4 mol (80.0 g) of trimethylsilyliodo was added. After stirring under reflux for 24 hours, 50 ml of water was added and the mixture was reacted by stirring under reflux for 12 hours. After cooling, free iodine was reduced with an aqueous sodium hydrogen sulfite and the organic layer was separated, and then the solvent was distilled off. The residue was reprecipitated with acetone and n-hexane and then baking under reduced pressure to obtain a copolymer $A_2$ (39.0 g) comprising 70 mol % of p-hydroxybenzylsilsesguioxane and 30 mol % of phenylsilsesguioxane. This copolymer is referred to as a silsesguioxane resin (X1). The silsesguioxane resin (X1) is represented by the following chemical formula (IV). In the formula, x:y=30 mol %:70 mol % and a weight average molecular weight was 10,000 and a dispersion degree (Mw/Mn) was about 1.5.

[Chemical Formula 5]

(IV)

Synthesis Example 2

In the same manner, except that phenyltrichlorosilane was not use in Synthesis Example 1, poly-p-hydroxybenzylsilsesguioxane represented by the following chemical formula (V) was prepared. The weight average molecular weight was 3,000 and the dispersion degree (Mw/Mn) was about 1.5

[Chemical Formula 6]

(V)

Example 1

Two-Layer Resist Method

The following component (A), (B), (C), (D) and (E) were uniformly dissolved in propyleneglycolmonomethylether acetate (solid content: 3.5% by weight) to prepare a negative photoresist composition.

As the component (A), 100 parts by weight of the silsesguioxane resin (X1) obtained in Synthesis Example 1 was used.

As the component (B), 10 parts by weight of triphenylsulfonium trifluoromethanesulfonate was used.

As the component (C), 10 parts by weight of a crosslinking agent represented by the following chemical formula (1) was used.

As the component (D) 0.8 parts by weight of trioctylamine was used.

As the component (E), 0.32 parts by weight of salicylic acid was used.

[Chemical Formula 7]

(1)

(2)

(3)

wherein Me represents a methyl group.

On a 8 inch silicon substrate, a novolak resin (manufactured by TOKYO OHKA KOGYO CO., LTD. under the trade name of TBLC-100) as a lower organic layer material was coated using a spinner and then baked at 230° C. for 90 seconds to form an organic layer (base film) having a thickness of 420 nm.

On the organic layer, the negative resist composition prepared previously was coated using a spinner, baked (hereinafter abbreviated to PAB, sometimes) at 90° C. for 90 seconds and then dried to form a resist layer, and thus a resist laminate was formed. Two kinds of upper resist layers each having a thickness of 50 nm or 100 nm were produced.

The resist layer is subjected to writing using an electron beam writer (manufactured by Hitachi, Ltd. under the trade name of HL-800D) set at an acceleration voltage of 70 kV.

After exposure under the conditions at a temperature of 110° C. for 90 seconds, the exposed resist layer was subjected to an overheat treatment (hereinafter abbreviated to PEB, sometimes) and then subjected to a development treatment using an aqueous 2.38% by weight tetramethylammonium hydroxide solution at 23° C. for 60 seconds. Then, the resist layer was rinsed with pure water for 30 seconds, shake-off dried and then dried with heating at 100° C. for 60 seconds to form an upper resist pattern.

Using this upper resist pattern as a mask and using a high vacuum RIE system (manufactured by TOKYO OHKA KOGYO CO., LTD.), the lower organic layer was patterned by dry etching with oxygen plasma to form a lower pattern.

In both cases where the thickness of the upper resist layer is 50 nm and 100 nm, resolution in a line-and-space pattern (L/S) was 50 nm and resolution in an isolated line pattern (Iso-Line) was 70 nm. Thickness loss of the resist pattern did not occur.

In case of the thickness of 50 nm and 100 nm, the solid content was adjusted to 3.5% by weight and 5% by weight.

Example 2

Single-Layer Resist

On a 8 inch silicon substrate subjected to surface modification treatment with HMDS, the same negative resist composition as that used in Example 1 was coated using a spinner, subjected to a PAB treatment at 90° C. for 90 seconds and then dried to form a resist layer. Two kinds of upper resist layers each having a thickness of 100 nm or 200 nm were produced.

The resist layer is subjected to writing using an electron beam writer (manufactured by Hitachi, Ltd. under the trade name of HL-800D) set at an acceleration voltage of 70 kV.

In the same manner as in Example 1, a PEB treatment, a development treatment, rinsing, a shake-off drying and drying with heating were conducted to form a resist pattern.

In both cases where the thickness of the upper resist layer is 100 nm and 200 nm, resolution in a line-and-space pattern was 50 nm and resolution in an isolated line pattern was 70 nm. Thickness loss of the resist pattern did not occur.

In case of the thickness of 100 nm and 200 nm, the solid content was adjusted to 5% by weight and 15% by weight.

Examples 3 to 24 and Comparative Example 1

As shown in Table 1 below, negative resist compositions were prepared. In Examples 3, 5, 7, 9, 11, 13, 15, 17, 19, 21 and 23, the same method as that used in Example 1 was used. In Examples 4, 6, 8, 10, 12, 14, 16, 18, 20, 22 and 24 and Comparative Example 1, the same method as that used in Example 2 was used. The conditions and evaluation results of Examples 1 to 24 are shown in Tables 2 and 3.

Although there is no description in the tables, thickness loss of the resist pattern did not occur in Examples 1 to 24.

In Table 1, PAG1 denotes triphenylsulfonium trifluoromethanesulfonate, PAG2 denotes triphenylsulfonium nonafluorobutanesulfonate, PAG3 denotes bis-O-(n-butylsulfonyl)-α-dimethylglyoxime, PAG4 denotes bis(cyclohexylsulfonyl)diazomethane, the chemical formulas (1) to (3) respectively denote compounds represented by the chemical formulas (1) to (3) of [Chemical Formula 7], PM denotes propylene glycol monomethyl ether acetate, and PE denotes propylene glycol monomethyl ether.

In Tables 2 and 3, L/S denotes resolution in a line-and-space pattern, and Iso-Line denotes resolution in an isolated line pattern.

TABLE 1

|  | (A) Resin | (B) Acid generator | (C) Crosslinking agent | Organic solvent | (D) Nitrogen-containing organic compound | (E) Organic carboxylic acid |
|---|---|---|---|---|---|---|
| Examples 1 to 2 | Resin 1 (100 parts by weight) | PAG1 (10 parts by weight) | Chemical Formula (1) (10 parts by weight) | PM | Trioctylamine (0.8 parts by weight) | Salicylic acid (0.32 parts by weight) |
| Examples 3 to 4 | Resin 1 (100 parts by weight) | PAG1 (10 parts by weight) | Chemical Formula (2) (7.3 parts by weight) | PM/PE = 3/7 | Trioctylamine (0.8 parts by weight) | Salicylic acid (0.32 parts by weight) |
| Examples 5 to 6 | Resin 1 (100 parts by weight) | PAG1 (10 parts by weight) | Chemical Formula (3) (10 parts by weight) | PM | Trioctylamine (0.8 parts by weight) | Salicylic acid (0.32 parts by weight) |
| Examples 7 to 8 | Resin 1 (100 parts by weight) | PAG2 (10 parts by weight) | Chemical Formula (1) (10 parts by weight) | PM | Trioctylamine (0.8 parts by weight) | Salicylic acid (0.32 parts by weight) |
| Examples 9 to 10 | Resin 1 (100 parts by weight) | PAG2 (10 parts by weight) | Chemical Formula (2) (7.3 parts by weight) | PM/PE = 3/7 | Trioctylamine (0.8 parts by weight) | Salicylic acid (0.32 parts by weight) |
| Examples 11 to 12 | Resin 1 (100 parts by weight) | PAG2 (10 parts by weight) | Chemical Formula (3) (10 parts by weight) | PM | Trioctylamine (0.8 parts by weight) | Salicylic acid (0.32 parts by weight) |
| Examples 13 to 14 | Resin 1 (100 parts by weight) | PAG3 (10 parts by weight) | Chemical Formula (1) (12 parts by weight) | PM | Trioctylamine (0.8 parts by weight) | Salicylic acid (0.32 parts by weight) |
| Examples 15 to 16 | Resin 1 (100 parts by weight) | PAG3 (10 parts by weight) | Chemical Formula (2) (7.3 parts by weight) | PM/PE = 3/7 | Trioctylamine (0.8 parts by weight) | Salicylic acid (0.32 parts by weight) |
| Examples 17 to 18 | Resin 1 (100 parts by weight) | PAG3 (10 parts by weight) | Chemical Formula (3) (10 parts by weight) | PM | Trioctylamine (0.8 parts by weight) | Salicylic acid (0.32 parts by weight) |
| Examples 19 to 20 | Resin 1 (100 parts by weight) | PAG3:PAG4 = 95:5 (10 parts by weight) | Chemical Formula (1) (10 parts by weight) | PM/PE = 3/7 | Trioctylamine (0.8 parts by weight) | Salicylic acid (0.32 parts by weight) |
| Examples 21 to 22 | Resin 1 (100 parts by weight) | PAG3:PAG4 = 95:5 (10 parts by weight) | Chemical Formula (2) (7.3 parts by weight) | PM/PE = 3/7 | Trioctylamine (0.8 parts by weight) | Salicylic acid (0.32 parts by weight) |
| Examples 23 to 24 | Resin 1 (100 parts by weight) | PAG3:PAG4 = 95:5 (10 parts by weight) | Chemical Formula (3) (10 parts by weight) | PM/PE = 3/7 | Trioctylamine (0.8 parts by weight) | Salicylic acid (0.32 parts by weight) |
| Comparative Example 1 | Resin 2 (100 parts by weight) | PAG3 (10 parts by weight) | Chemical Formula (2) (7.3 parts by weight) | PM/PE = 3/7 | Trioctylamine (0.8 parts by weight) | Salicylic acid (0.32 parts by weight) |

TABLE 2

|  | Substrate | Lower layer film (nm) | Resist film thickness (nm) | PAB | PEB | L/S | Iso-Line |
|---|---|---|---|---|---|---|---|
| Example 1 | 8 inch silicon wafer | 420 nm | 100/200 | 90° C./90 sec | 110° C./90 sec | 50 nm | 70 nm |
| Example 2 | 8 inch silicon wafer | — | 50/100 | 90° C./90 sec | 110° C./90 sec | 50 nm | 70 nm |
| Example 3 | 8 inch silicon wafer | 420 nm | 100/200 | 90° C./90 sec | 110° C./90 sec | 50 nm | 70 nm |
| Example 4 | 8 inch silicon wafer | — | 50/100 | 90° C./90 sec | 110° C./90 sec | 50 nm | 70 nm |
| Example 5 | 8 inch silicon wafer | 420 nm | 100/200 | 90° C./90 sec | 110° C./90 sec | 50 nm | 70 nm |
| Example 6 | 8 inch silicon wafer | — | 50/100 | 90° C./90 sec | 110° C./90 sec | 50 nm | 70 nm |
| Example 7 | 8 inch silicon wafer | 420 nm | 100/200 | 90° C./90 sec | 110° C./90 sec | 50 nm | 70 nm |
| Example 8 | 8 inch silicon wafer | — | 50/100 | 90° C./90 sec | 110° C./90 sec | 50 nm | 70 nm |
| Example 9 | 8 inch silicon wafer | 420 nm | 100/200 | 90° C./90 sec | 110° C./90 sec | 50 nm | 70 nm |
| Example 10 | 8 inch silicon wafer | — | 50/100 | 90° C./90 sec | 110° C./90 sec | 50 nm | 70 nm |
| Example 11 | 8 inch silicon wafer | 420 nm | 100/200 | 90° C./90 sec | 110° C./90 sec | 50 nm | 70 nm |
| Example 12 | 8 inch silicon wafer | — | 50/100 | 90° C./90 sec | 110° C./90 sec | 50 nm | 70 nm |
| Example 13 | 8 inch silicon wafer | 420 nm | 100/200 | 90° C./90 sec | 110° C./90 sec | 50 nm | 70 nm |

TABLE 3

|  | Substrate | Lower layer film (nm) | Resist film thickness (nm) | PAB | PEB | L/S | Iso-Line |
|---|---|---|---|---|---|---|---|
| Example 14 | 8 inch silicon wafer | — | 50/100 | 90° C./90 sec | 110° C./90 sec | 50 nm | 70 nm |
| Example 15 | 8 inch silicon wafer | 420 nm | 100/200 | 90° C./90. sec | 110° C./90 sec | 50 nm | 70 nm |
| Example 16 | 8 inch silicon wafer | — | 50/100 | 90° C./90 sec | 110° C./90 sec | 50 nm | 70 nm |
| Example 17 | 8 inch silicon wafer | 420 nm | 100/200 | 90° C./90 sec | 110° C./90 sec | 50 nm | 70 nm |
| Example 18 | 8 inch silicon wafer | — | 50/100 | 90° C./90 sec | 110° C./90 sec | 50 nm | 70 nm |
| Example 19 | 8 inch silicon wafer | 420 nm | 100/200 | 90° C./90 sec | 110° C./90 sec | 50 nm | 70 nm |
| Example 20 | 8 inch silicon wafer | — | 50/100 | 90° C./90 sec | 110° C./90 sec | 50 nm | 70 nm |
| Example 21 | 8 inch silicon wafer | 420 nm | 100/200 | 90° C./90 sec | 110° C./90 sec | 50 nm | 70 nm |
| Example 22 | 8 inch silicon wafer | — | 50/100 | 90° C./90 sec | 110° C./90 sec | 50 nm | 70 nm |
| Example 23 | 8 inch silicon wafer | 420 nm | 100/200 | 90° C./90 sec | 110° C./90 sec | 50 nm | 70 nm |
| Example 24 | 8 inch silicon wafer | — | 50/100 | 90° C./90 sec | 110° C./90 sec | 50 nm | 70 nm |
| Comparative Example 1 | 8 inch silicon wafer | — | 100 | 90° C./90 sec | 110° C./90 sec | impossible to use because of too large thickness loss, although resolution can be conducted | |

As is apparent from the results of these examples, according to the negative photoresist of the present invention, a fine resist pattern, particularly a fine isolated line pattern can be formed. Therefore, since a fine magnetic film pattern is formed of the negative photoresist composition of the present invention using the above magnetic film pattern forming method, scaling-down of the size of the magnetic head can be conducted.

INDUSTRIAL APPLICABILITY

The negative resist composition of the present invention can be applied for formation of a fine resist pattern having a high aspect ratio without causing thickness loss.

The invention claimed is:

1. A negative resist composition comprising a silsesquioxane resin (A) comprising a constituent unit (a1) represented by the following general formula (I):

[Chemical Formula 1]

(I)

wherein $R^1$ represents a methylene group, a constituent unit (a2) represented by the following general formula (II):

[Chemical Formula 2]

(II)

and a constituent unit (a3) represented by the following general formula (III):

[Chemical Formula 3]

(III)

wherein $R^2$ represents a linear or branched alkylene group having 1 to 5 carbon atoms, and $R^3$ represents a linear or branched alkyl group having 1 to 5 carbon atoms, an acid generator component (B) which generates an acid upon exposure, a crosslinking agent component (C), a nitrogen-containing organic compound (D) and an organic carboxylic acid or oxo acid of phosphorus or a derivative thereof (E), wherein said silsesquioxane resin (A) comprises 50 to 95 mol % of the constituent unit (a1) 5 to 40 mol % of the constituent unit (a2), and 0 to 20 mol % of the constituent unit (a3), wherein said acid generator component (B) and said crosslinking agent component (C) are selected from a combination of an oxime sulfonate-based acid generator (B) and an ethyleneurea-based crosslinking agent (C), or a combination of a mixture of an oxime sulfonate-based acid generator and a diazomethane-based acid generator (B) and an ethyleneurea-based crosslinking agent (C).

2. The negative resist composition according to claim 1, wherein a weight average molecular weight (Mw) of the silsesquioxane resin (A) is 1,000 or more and 15,000 or less.

3. A two-layer resist method comprising the steps of providing an organic layer on a substrate and providing a resist layer on the organic layer; patterning the resist layer to form an upper resist pattern; patterning the organic layer by dry etching using the upper resist pattern as a mask to form a lower resist pattern; and forming a pattern on the substrate by etching using the upper resist pattern and the lower resist pattern as a mask, wherein the resist layer is formed from the negative resist composition according to claim 1.

4. A magnetic film pattern forming method comprising the step of patterning a magnetic film by ionic etching using a resist pattern formed on the magnetic film as a mask, wherein the resist pattern is formed from the negative resist composition according to claim 1.

5. A magnetic film pattern forming method comprising the step of patterning a magnetic film by ionic etching using a lift-off pattern comprising a base film pattern formed on the magnetic film and a resist pattern formed on the base film pattern, wherein the resist pattern is formed from the negative resist composition according to claim 1.

6. A resist pattern forming method comprising the step of subjecting a resist layer to electron beam selective exposure, wherein the resist layer is formed from the negative resist composition according to claim 1.

* * * * *